United States Patent
Kiguchi

(10) Patent No.: US 7,205,713 B2
(45) Date of Patent: Apr. 17, 2007

(54) ORGANIC ELECTROLUMINESCENT DEVICE AND ELECTRONIC APPARATUS HAVING SPECIFIC SUB-PIXEL PATTERN

(75) Inventor: Hiroshi Kiguchi, Suwa (JP)

(73) Assignee: Seiko Epson Corporation (JP)

( * ) Notice: Subject to any disclaimer, the term of this patent is extended or adjusted under 35 U.S.C. 154(b) by 233 days.

(21) Appl. No.: 10/835,250

(22) Filed: Apr. 29, 2004

(65) Prior Publication Data
US 2005/0001542 A1    Jan. 6, 2005

(30) Foreign Application Priority Data
May 1, 2003    (JP)    ............... 2003-126316

(51) Int. Cl.
*H01J 1/62* (2006.01)
(52) U.S. Cl. ...................... 313/504; 313/498
(58) Field of Classification Search ........ 313/498–509, 313/582–587
See application file for complete search history.

(56) References Cited

U.S. PATENT DOCUMENTS

| 6,768,482 B2 | 7/2004 | Asano et al. |
| 6,919,681 B2* | 7/2005 | Cok et al. ............. 313/500 |
| 2003/0025662 A1 | 2/2003 | Park |
| 2004/0051724 A1* | 3/2004 | Elliott et al. ............. 345/694 |

FOREIGN PATENT DOCUMENTS

| CN | 2003-0011530 | 10/2002 |
| CN | 1376014 A | 10/2002 |
| JP | 06-102503 | 4/1994 |

OTHER PUBLICATIONS

Communications from Chinese Patent Office re: related application.
Communication from Korean Patent Office re: related application.

* cited by examiner

*Primary Examiner*—Joseph Williams
*Assistant Examiner*—Bumsuk Won
(74) *Attorney, Agent, or Firm*—Harness, Dickey & Pierce, P.L.C.

(57) ABSTRACT

An organic electroluminescent device includes electrodes, a luminescent layer which is sandwiched between the electrodes, and which includes dots consisting of red sub-pixels, green sub-pixels, and blue sub-pixels. The sub-pixels are arranged in predetermined patterns, each of the predetermined patterns being formed such that at least one blue sub-pixel is disposed as a central pattern, the red sub-pixels are symmetrically arranged about a central point of the central pattern, and the green sub-pixels are also symmetrically arranged about the central point of the central pattern.

7 Claims, 16 Drawing Sheets stripe mosaic delta

ORGANIC ELECTROLUMINESCENT DEVICE AND ELECTRONIC APPARATUS HAVING SPECIFIC SUB-PIXEL PATTERN

BACKGROUND OF THE INVENTION

1. Field of the Invention

The present invention relates to an organic electroluminescent device and to an electronic apparatus having the organic electroluminescent device.

Priority is claimed on Japanese Patent Application No. 2003-126316, filed May 1, 2003, the content of which is incorporated herein by reference.

2. Description of Related Art

Currently, display devices must be capable of displaying color images. In general, in order to display color images, plural sets of three kinds of dots, i.e., plural sets of red, green, and blue dots, which respectively emit red light (R), green light (G), and blue light (B), as minimum displaying units (sub-pixels), are used. These three kinds of dots form one pixel which is a minimum unit for color displaying.

As arrangement patterns of such dots (sub-pixels) for forming pixels, a stripe pattern shown in FIG. 12A, a mosaic pattern shown in FIG. 12B, and a delta pattern shown in FIG. 12C, are known in the art.

In addition, another arrangement pattern, in which four dots (cells), each of which emits one of red light (R), green light (G), and blue light (B), are arranged in a substantially four-dot (cell) matrix pattern for forming one pixel, is also known in the art (see, for example, Japanese Unexamined Patent Application, First Publication No. Hei 06-102503).

The above-mentioned stripe pattern, mosaic pattern, delta pattern, and the pattern in which four dots (cells) are arranged in a substantially matrix pattern, have been basically conceived to facilitate control of driving each of the dots. In particular, in the case of the stripe pattern, mosaic pattern, and delta pattern, substantially the same quantities of red, green, and blue dots are arranged overall, as well as in each of the pixels, and thereby the driving method for the pixels is simplified.

However, in view of perception, it is not suitable for the human visual system to form each of the pixels so as to include the same quantities of red, green, and blue dots.

More specifically, in the case of human beings, the capability of distinguishing colors resides in the light sense organ in the macula lutea of the eyes, and retina cones which detect colored light are classified into three types, i.e., S-type, L-type, and M-type, respectively corresponding to blue color, red color, and green color. When observing a micrograph of the macula lutea, the retina cones are observed as spots which are distinguishable from each other. Assuming that the quantities of the red and green retina cones are "10", the quantity of the blue retina cones is only "1" on average; therefore, the relative ratio among the red retina cones, the green retina cones, and the blue retina cones, is 10:10:1.

Accordingly, the detailed visual information is detected (visually sensed) by (i.e., resolution is determined by) primarily the red and green retina cones, and the blue retina cones are not elements for detecting detailed visual information even though they are elements for distinguishing colors.

In the case of a pattern in which four dots (cells) are arranged in the substantially matrix pattern, for example, the quantity of the blue sub-pixels can be increased; however, it is difficult to improve the resolution since this arrangement is basically conceived to facilitate the drive control operation. Moreover, this technology is, in particular, applied to display devices such as a plasma display, a CRT (Cathode Ray Tube), a liquid crystal display, a fluorescent display tube, an electroluminescent display, and a light emitting diode display. In recent years, organic electroluminescent displays have been remarkably developed; however, the application to organic electroluminescent devices is not considered in the above-mentioned technology.

SUMMARY OF THE INVENTION

The present invention was conceived in view of the above circumstances, and an object thereof is to provide an organic electroluminescent device which enables an excellent display by improving the apparent resolution in terms of the human visual system without significantly decreasing pitches among the pixels. Another object thereof is to provide an electronic apparatus including such an organic electroluminescent device.

In order to achieve the above objects, the present invention provides an organic electroluminescent device including: electrodes; a luminescent layer which is sandwiched between the electrodes, and which includes dots consisting of red sub-pixels, green sub-pixels, and blue sub-pixels; wherein the sub-pixels are arranged in predetermined patterns, each of the predetermined patterns being formed such that at least one blue sub-pixel is disposed as a central pattern, the red sub-pixels are symmetrically arranged about a central point of the central pattern, and the green sub-pixels are also symmetrically arranged about the central point of the central pattern.

According to the above organic electroluminescent device, because each of the predetermined patterns is formed such that at least one blue sub-pixel is disposed as a central pattern, the red sub-pixels are symmetrically arranged about a central point of the central pattern, and the green sub-pixels are also symmetrically arranged about the central point of the central pattern, each pixel is not formed of three sub-pixels, i.e., the red, green, and blue sub-pixels, but is formed of more than three sub-pixels; therefore, the apparent resolution can be improved without significantly decreasing pitches among the pixels. Accordingly, excellent image display can be achieved, high quality and stable quality of the display can be achieved, and throughput of the displays can be increased.

In the above organic electroluminescent device, each of the sub-pixels may be formed in a rectangular shape, and the central pattern may consist of two blue sub-pixels.

According to the above organic electroluminescent device, each of the colored sub-pixels can be easily formed in a manner similar to forming the sub-pixels in the conventional stripe pattern or mosaic pattern.

In the above organic electroluminescent device, each of the sub-pixels may be formed in a rectangular shape, and the central pattern may consist of one blue sub-pixel, which is made longer than the red and green sub-pixels.

According to the above organic electroluminescent device, each of the colored sub-pixels can be easily formed in a manner similar to forming the sub-pixels in the conventional stripe pattern or mosaic pattern, and the blue sub-pixels may be formed at a pitch which is greater than that of other colored sub-pixels.

In the above organic electroluminescent device, the blue sub-pixels may be formed in a square shape, and the central pattern may consist of one blue sub-pixel. Each of the predetermined patterns may be formed in a substantially square shape, and may be formed such that each of the red and green sub-pixels is disposed adjacent to one of sides of the square-shaped blue sub-pixel.

According to the above organic electroluminescent device, the apparent resolution can be preferably improved without significantly decreasing pitches among the pixels by forming each of the pixels so as to include, for example, one blue sub-pixel and more than three (e.g., six) sub-pixels.

The present invention further provides an electronic apparatus including one of the organic electroluminescent devices.

According to the above electronic apparatus, because the electronic apparatus includes the organic electroluminescent device which is capable of displaying excellent images, the electronic apparatus itself is also capable of displaying excellent images.

DETAILED DESCRIPTION OF THE INVENTION

The present invention will be explained in detail below.

Figure 1:
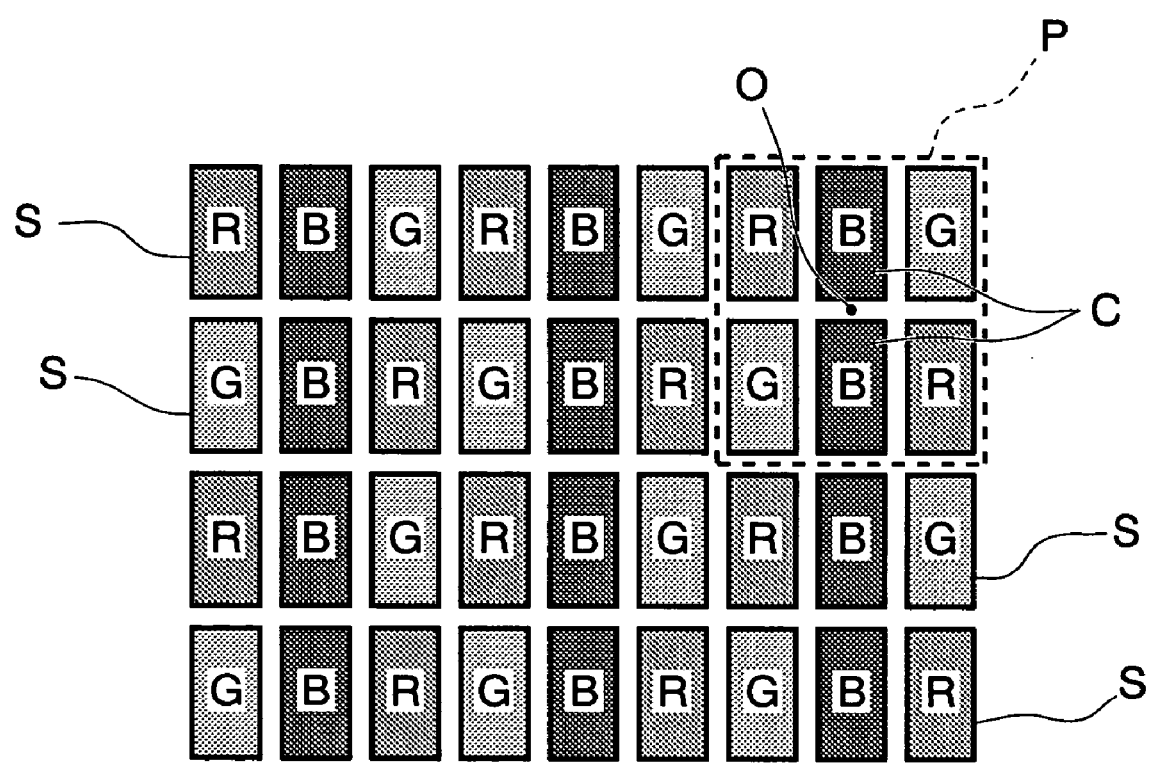
FIG. 1 is a diagram showing an arrangement pattern of sub-pixels in an organic electroluminescent device according to the present invention.

FIG. 1 is a diagram showing an embodiment of an organic electroluminescent device according to the present invention, and is a diagram showing arrangement pattern of sub-pixels in a luminescent layer. In FIG. 1, reference symbol S indicates sub-pixels which form dots in the luminescent layer. The sub-pixels S include three colored sub-pixels, i.e., red sub-pixels (indicated by "R" in FIG. 1, and hereinafter referred to as sub-pixels R), green sub-pixels (indicated by "G" in FIG. 1, and hereinafter referred to as sub-pixels G), and blue sub-pixels (indicated by "B" in FIG. 1, and hereinafter referred to as sub-pixels B).

These three colored sub-pixels S (R, G, and B) are formed as rectangles having the same size, and in this embodiment, each of arrangement patterns P includes six sub-pixels. The luminescent layer of this embodiment is formed by arranging the arrangement patterns P horizontally and vertically (as viewed in FIG. 1).

As shown in FIG. 1, each of the arrangement patterns P includes two blue sub-pixels B arranged vertically (as viewed in FIG. 1) as a central pattern C, two sets of red sub-pixel R and green sub-pixel G respectively arranged in the right and left of the central pattern C. Two red sub-pixels R are symmetrically arranged about a central point O of the central pattern C, and two green sub-pixels G are also symmetrically arranged about the central point O of the central pattern C.

In the present invention, each of the arrangement patterns P is determined merely for defining how the respective colored sub-pixels are arranged in the manufacturing processes, and does not form a unit pixel for displaying.

As shown in FIGS. 2A to 2E, each of the pixels (unit pixel) L includes six sub-pixels S (R, G, and B). FIGS. 2A to 2E show five ways for forming a pixel L, the pixel L including a common green sub-pixel G, four sub-pixels S arranged horizontally, and two sub-pixels S respectively disposed two vertical positions with respect to one of the horizontally arranged four sub-pixels S.

Figure 12A:
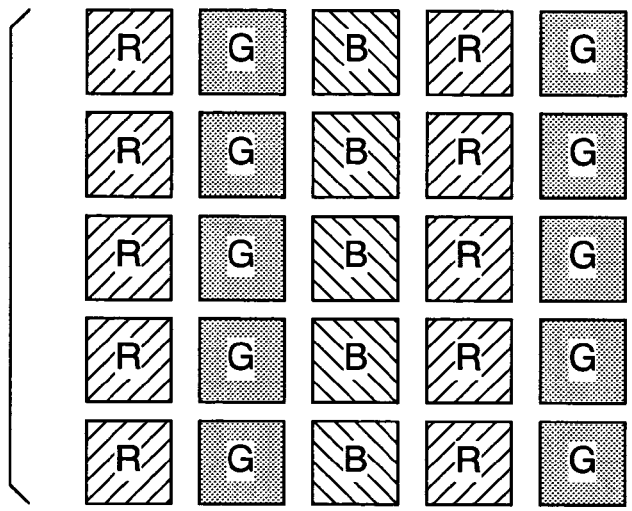
FIGS. 12A to 12C are diagrams showing conventional arrangement patterns of sub-pixels.
Figure 12B:
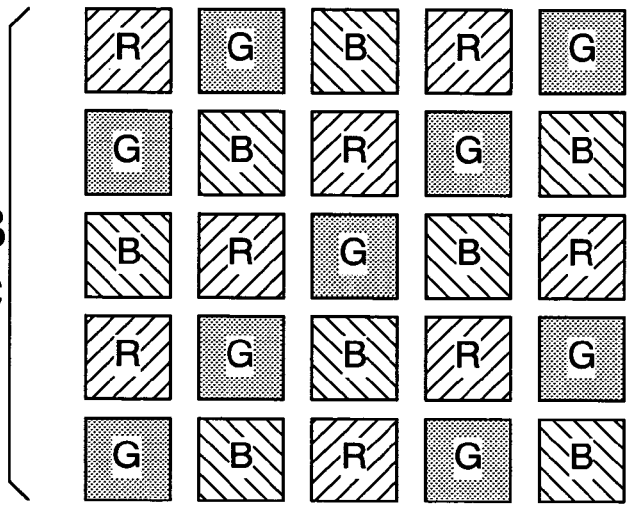
Figure 12C:
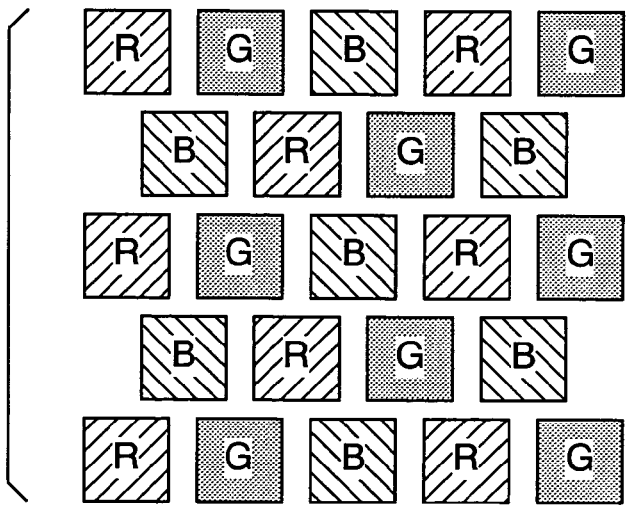

Each pixel L is an information pixel, which is also referred to as a theoretical pixel, in which the sub-pixels S are more efficiently used than in the case of conventional RGB systems shown in FIGS. 12A to 12C. More specifically, in the theoretical pixels in the RGB stripe pattern, the red, green, and blue sub-pixels are arranged in a fixed manner; however, in the arrangement examples shown in FIGS. 2A to 2E, the theoretical pixel L includes-six sub-pixels S (R, G, and B), and in particular, the green sub-pixels G and the red sub-pixels R are commonly used in the plural theoretical pixels L (five theoretical pixels L). The specific green sub-pixel G, which is commonly used in five theoretical pixels L, is located at the substantially central position in one of the theoretical pixels L (FIG. 2A), and is located at a peripheral position in the other four of the theoretical pixels L (FIGS. 2B to 2E).

Figures 2A, 2B, 2C, 2D, 2E:
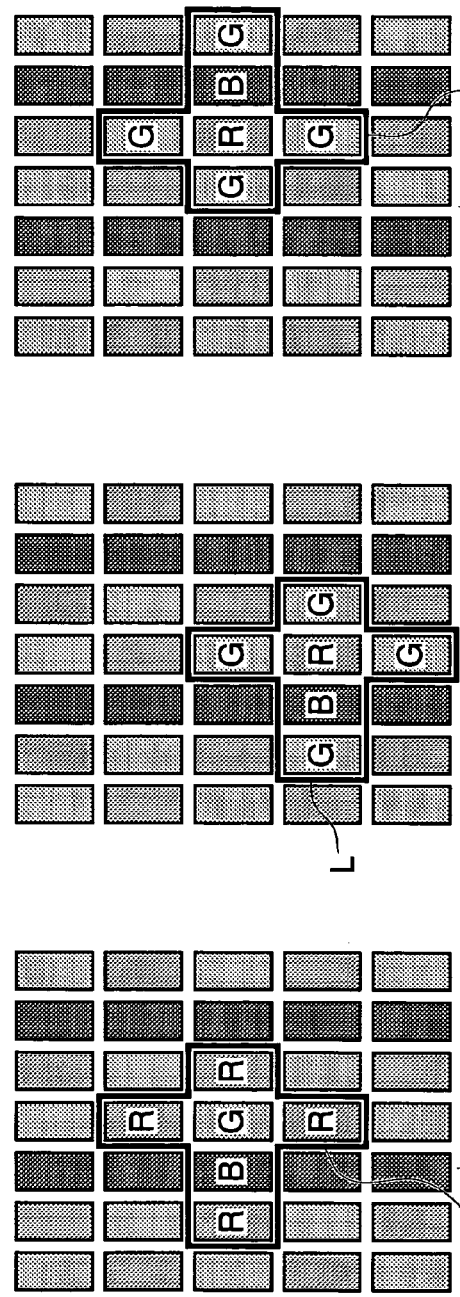
FIGS. 2A to 2E are diagrams respectively showing pixels formed of sub-pixels.
Figure 3:
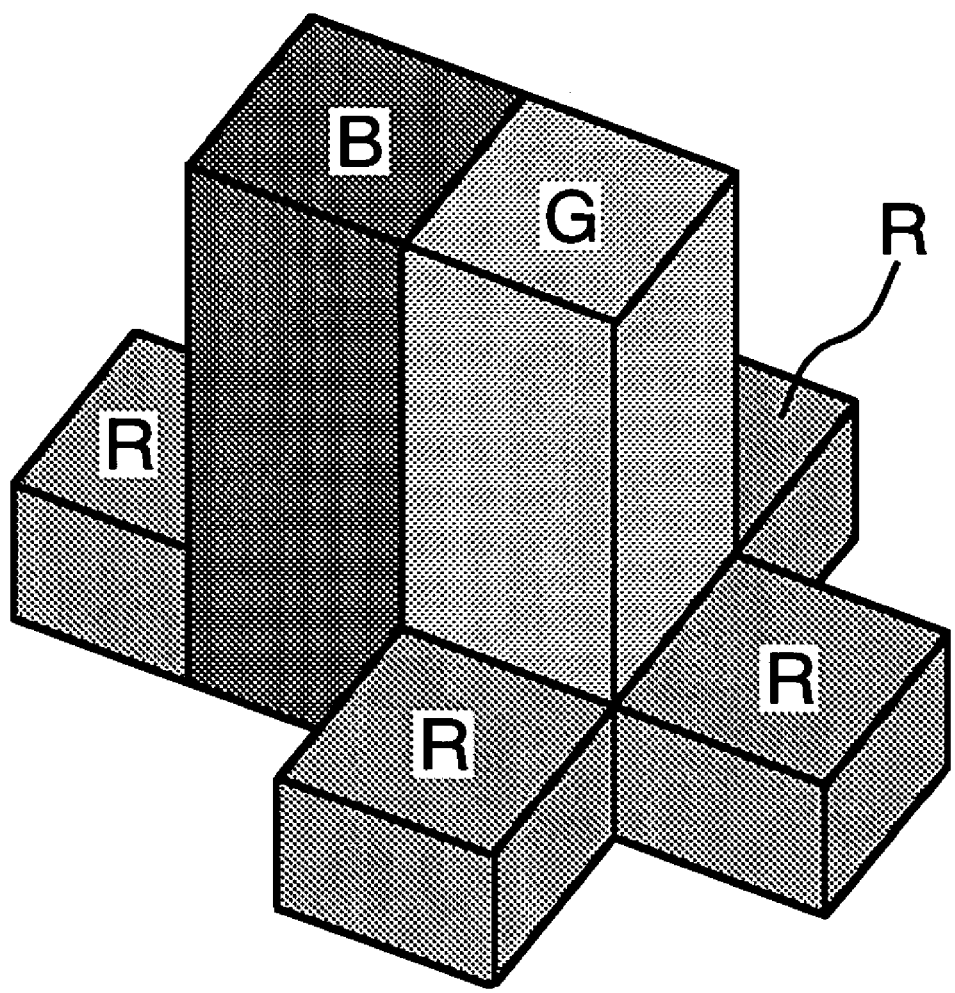
FIG. 3 is a diagram showing energy distribution when a pixel displays white color.

FIG. 3 is a diagram showing energy distribution when the theoretical pixel L, in which the specific green sub-pixel G is located at the substantially central position as shown in FIG. 2A, emits white light. As shown in FIG. 3, when the energy supplied to the peripheral sub-pixels (the red and blue sub-pixels R and B in this case) is adjusted so that the peripheral sub-pixels merge with the green sub-pixel G, the theoretical pixel L emits white light, i.e., the theoretical pixel L is perceived as a white spot. In the cases in which the red sub-pixel R, instead of the green sub-pixel G, is located at the substantially central position as shown in FIGS. 2B to 2E, the energy distribution when a white spot is displayed is basically the same as shown in FIG. 3 except that the positions of the green and red sub-pixels are interchanged.

Figure 4:
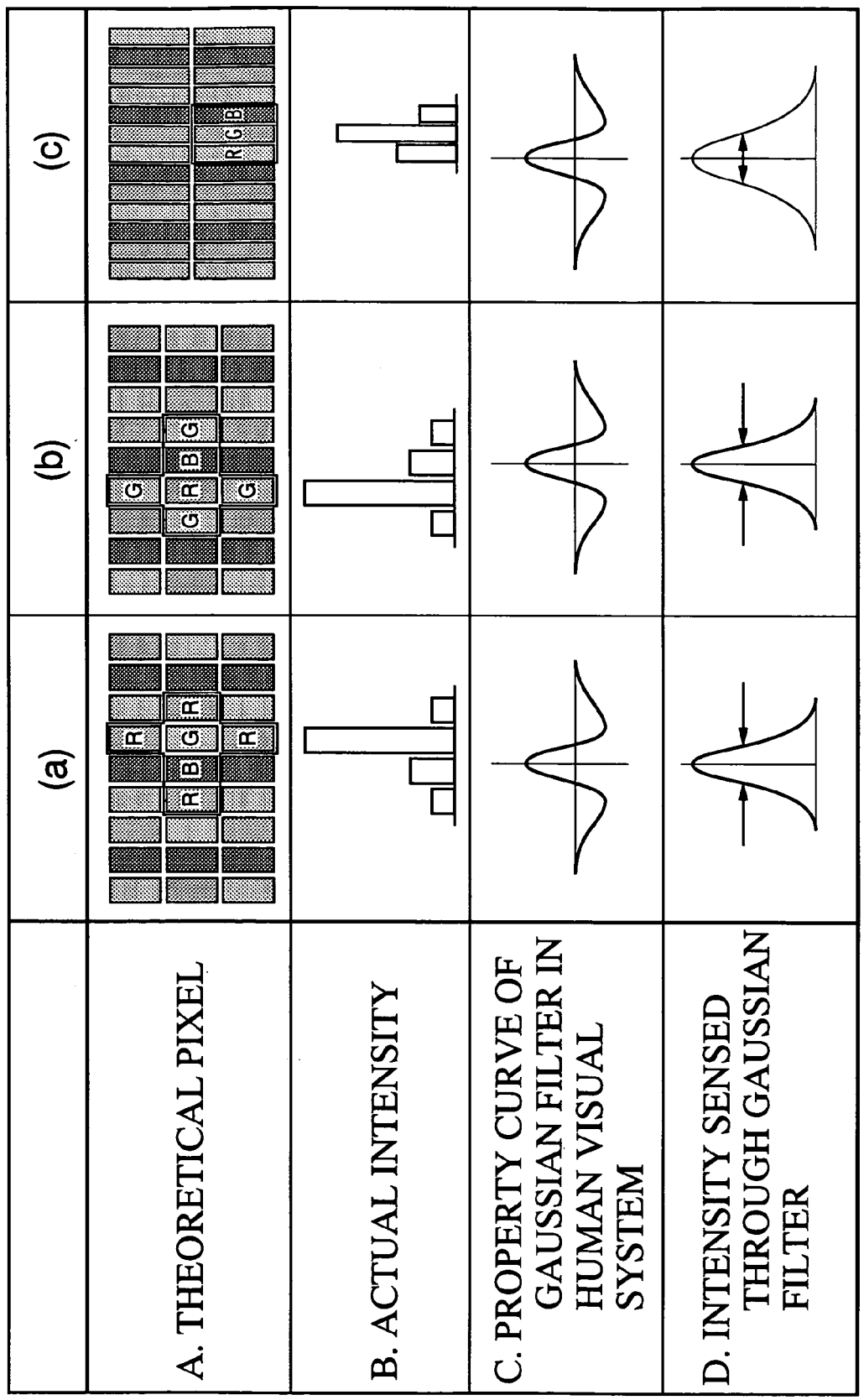
FIG. 4 is a table comparing light intensities when a white spot is displayed in three types of displays.

FIG. 4 is a table comparing light intensities in the theoretical pixel L shown in FIG. 2A, in the theoretical pixel L shown in FIG. 2C, and in a pixel having a conventional RGB stripe pattern having a sub-pixel. density (i.e., density of TFT) which is equivalent to that of these theoretical pixels L. Column (a) in FIG. 4 corresponds to the theoretical pixel L shown in FIG. 2A, column (b) in FIG. 4 corresponds to the theoretical pixel L shown in FIG. 2C, and column (c) in FIG. 4 corresponds to the pixel having a conventional RGB stripe pattern.

Row A in FIG. 4 shows theoretical pixels (i.e., arrangement patterns of sub-pixels) to be compared. Row B in FIG. 4 shows actual light intensities which are obtained by observing the sub-pixels using an optical measuring device.

Row C in FIG. 4 shows the property of the Gaussian filter included in the human visual systems, through which a person perceives and processes light. Row D in FIG. 4 shows light intensities which are actually perceived via the Gaussian filter.

As shown in row D in FIG. 4, it was revealed that the property curve perceived on the theoretical pixels L in this embodiment shown in FIGS. 2A and 2C is more acute than the property curve perceived on the conventional pixel. Such an effect is obtained based on the relationship between the human visual system and the intensity of the central light.

Accordingly, when the theoretical pixel in this embodiment and the conventional pixel have substantially the same sub-pixel density (i.e., density of TFT), the theoretical pixel in this embodiment gives an improved apparent resolution due to the actually perceived light intensity.

In this embodiment, as shown in FIGS. 2A and 2C, the pixel L (theoretical pixel), which is a display unit in the luminescent layer, is constituted with the theoretical pixel L including four green sub-pixels G and the theoretical pixel L including four red sub-pixels R. By incorporating many green sub-pixels G and red sub-pixels R into the pixel L in such a manner, an image display, which matches the human visual system, can be achieved. More specifically, by setting an amount of display for the red and green retina cones, which mainly contribute to perceiving detailed information (i.e., contribute to resolution), to be greater than that for the blue retina cones, which does not contribute to perceiving detailed information and merely contributes to distinguishing colors, the actually perceived light intensity can be made sharp, i.e., the apparent resolution can be improved even though the sub-pixel density (i.e., density of TFT) is set to be substantially the same as in conventional displays.

Next, a wiring structure of an organic EL display having luminescent layers in which sub-pixels S are arranged as described above will be explained below with reference to FIG. 5.

Figure 5:
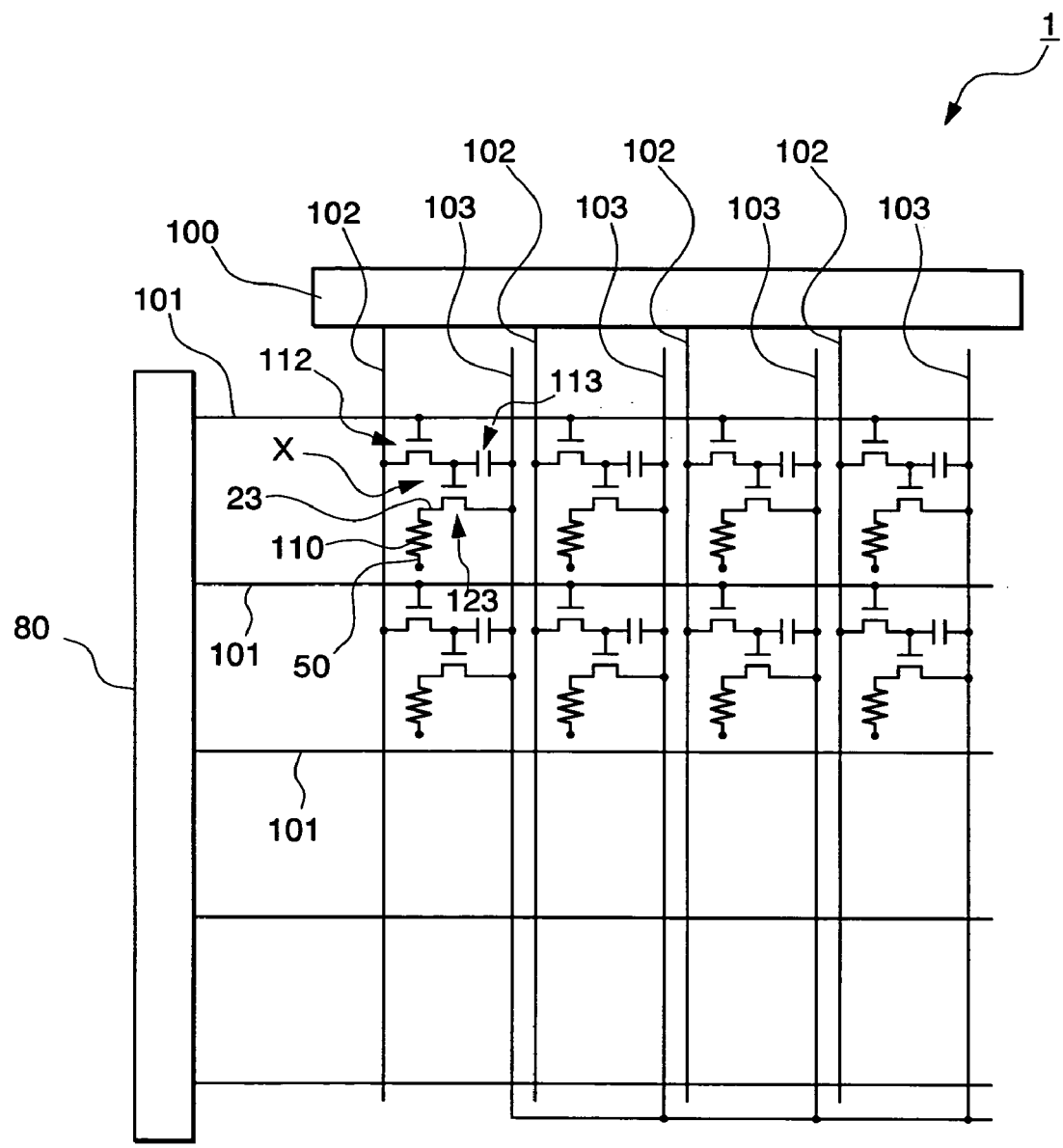
FIG. 5 is a schematic diagram showing an electric line arrangement of the organic electroluminescent device according to the present invention.

The organic electroluminescent device 1 shown in FIG. 5 is an organic electroluminescent device of an active matrix type in which thin film transistors (hereinafter abbreviated as TFTs) are employed as switching elements.

As shown in FIG. 5, the organic electroluminescent device 1 includes scanning lines 101, signal lines 102 which extend perpendicularly to the scanning lines 101, source lines 103 which extend in parallel to the signal lines 102, and pixel regions X, each provided in the vicinity of each of the intersecting points of the scanning lines 101 and the signal lines 102.

A data line drive circuit 100, which includes shift registers, level shifters, video lines, and analog switches, is connected to the signal lines 102. A scanning line drive circuit 80, which includes shift registers and level shifters, is connected to the scanning lines 101.

Moreover, each of the pixel regions X is provided with a switching TFT 112 whose gate electrode is provided with scanning signals via the scanning lines 101, a retaining capacitor 113 for retaining image signals provided from the signal lines 102 via the switching TFT 112, a driving TFT 123 whose gate electrode is provided with the image signals retained by the retaining capacitor 113, a pixel electrode (an electrode) 23 to which drive current is supplied from the source lines 103 when the pixel electrode 23 is electrically connected to the source lines 103, an active layer 110 which is sandwiched between the pixel electrode 23 and a cathode electrode 50 (another electrode).

In the organic electroluminescent device 1, when the switching TFTs 112 are turned on by the drive of the scanning lines 101, electrical potential in the signal lines 102 at the time is retained in the retaining capacitors 113, and the driving TFTs 123 are turned on or off depending on the state of the retaining capacitors 113. Drive current flow from the source lines 103 to the pixel electrodes 23 via the channels of the driving TFTs 123, and electrical current flows to the cathode electrode 50 via the active layers 110. Each of the active layers 110 emits light depending on the magnitude of electrical current flowing therethrough.

Next, the general construction of the organic electroluminescent device 1 according to the present embodiment will be explained below.

Figure 6:
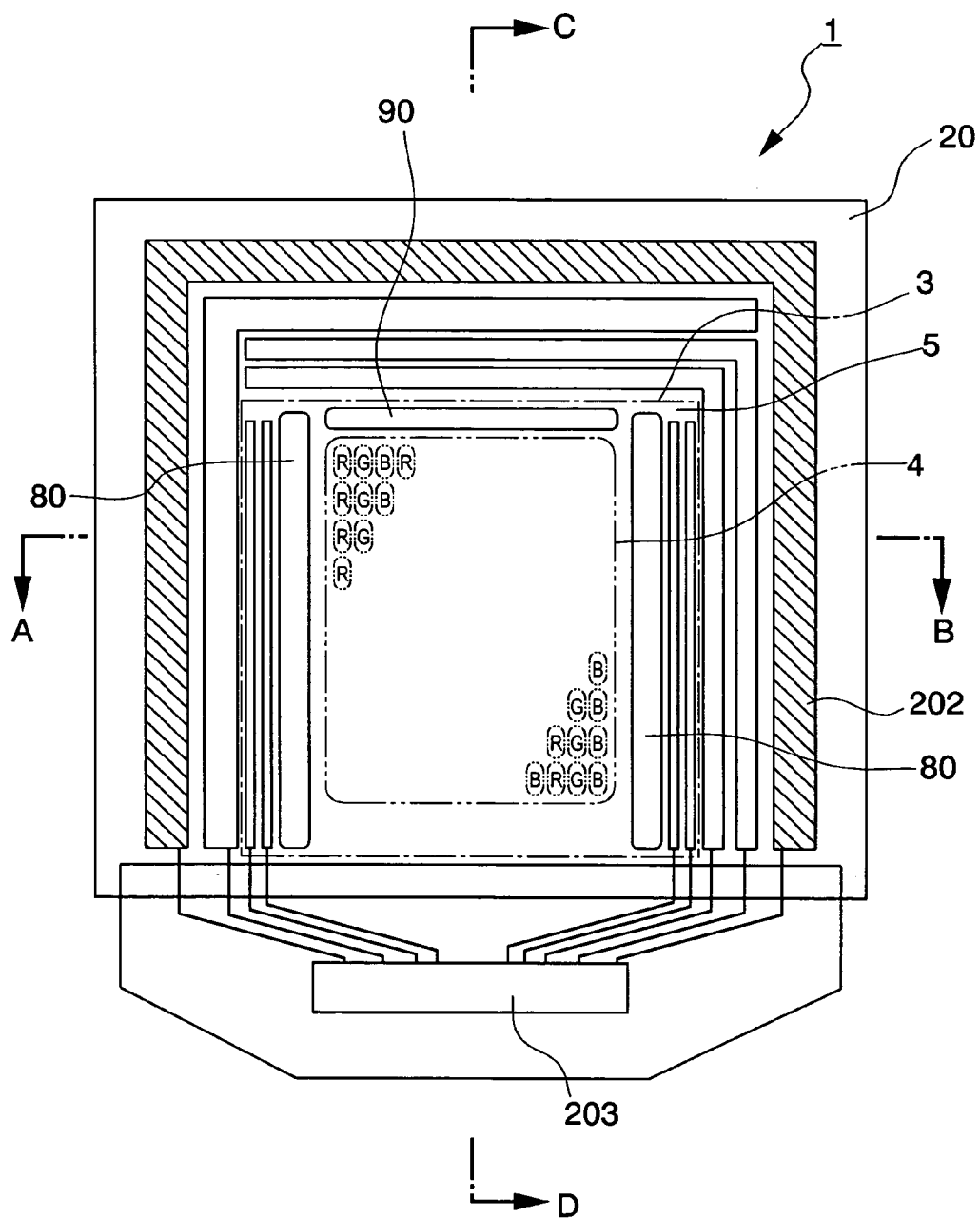
FIG. 6 is a schematic diagram showing the structure of the organic electroluminescent device according to the present invention.

As shown in FIG. 6, the organic electroluminescent device 1 according to the present embodiment, which is of an active matrix type, includes a substrate 20 made of an electrically insulating material, a pixel electrode region (not shown) in which pixel electrodes connected to the switching TFTs (not shown in FIG. 6) are arranged in a matrix pattern, source lines (not shown in FIG. 6) which are disposed around the pixel electrode region, and which are connected to the pixel electrodes, a pixel region 3 (disposed in an area indicated by a chain line in FIG. 6) which is formed in a rectangular shape in plan view, and which is disposed on at least the pixel electrode region.

The pixel region 3 is divided into two regions, one of which is an actual display region 4 which is disposed in the middle portion (disposed in an area indicated by a two-dot chain line in FIG. 6), the other of which is a dummy region 5 disposed around the actual display region 4 (i.e., the region between the chain line and the two-dot chain line).

In the actual display region 4, rectangular sub-pixels R, G, and B, each of which includes the pixel electrode, are arranged in a matrix pattern such that the sub-pixels R, G, and B are separated from each other in the "A to B" direction and in the "C to D direction", as shown in FIG. 6.

Moreover, in the right and left of the actual display region 4, as viewed in FIG. 6, there are provided scanning line driving circuits 80. The scanning line driving circuits 80 are disposed under the dummy region 5.

Furthermore, above the actual display region 4, as viewed in FIG. 6, there is provided a test circuit 90. The test circuit 90 is provided to check an operation status of the organic electroluminescent device 1, and includes, for example, a test information output means (not shown) for outputting test results to an exterior unit, so that quality and defects of the display device during the manufacturing processes and at shipping can be checked and detected. The test circuit 90 is also disposed under the dummy region 5.

The scanning line driving circuits 80 and the test circuit 90 are constructed such that drive voltage is applied thereto from an electrical power source via a drive voltage supply path 310 (see FIG. 7) and the like. Moreover, drive control signals and drive voltage for the scanning line driving circuits 80 and the test circuit 90 are sent and supplied from a main driver, which controls the operations of the organic electroluminescent device 1, via a drive control signal supply path 320 (see FIG. 7) and the like. In this case, the drive control signals are defined as command signals from the main driver or the like which contributes to control operations when the scanning line driving circuits 80 and the test circuit 90 send out signals.

Figure 7:
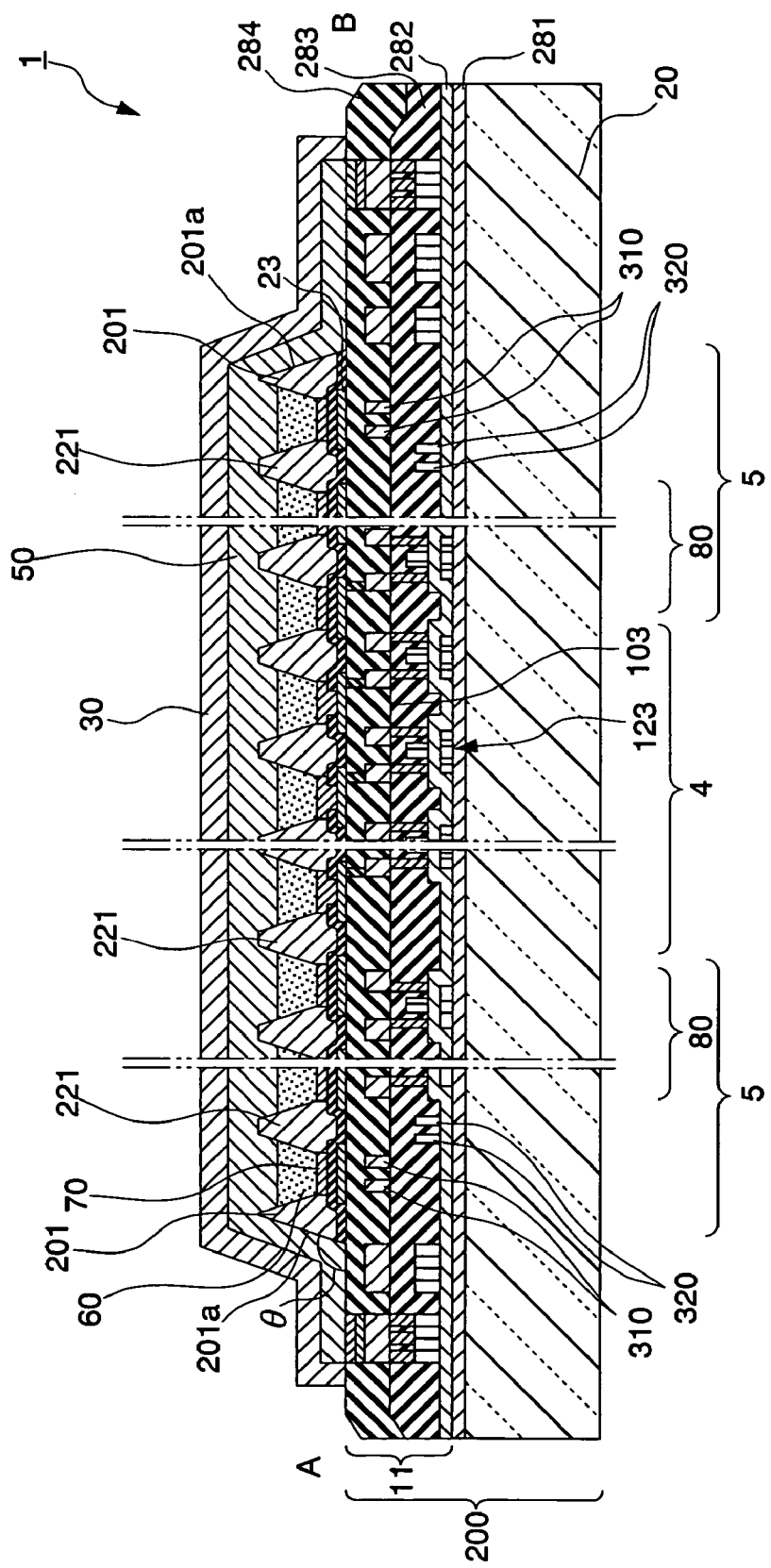
FIG. 7 is a cross-sectional view taken along the line A–B in FIG. 6.

As shown in FIG. 7, the organic electroluminescent device 1 includes a base body 200, many luminescent elements (organic electroluminescent elements), each of which includes a pixel electrode 23, a luminescent layer 60, and a cathode electrode 50, formed on the base body 200.

As a substrate 20 forming a portion of the base body 200, either a transparent substrate or an opaque substrate may be employed when the organic electroluminescent device 1 is of a so-called top emission type because light is emitted through a sealing portion (not shown) which is disposed opposite to the substrate 20. As an example of the opaque substrate, a substrate made of ceramics such as alumina, a substrate of a metal sheet, such as a stainless steel sheet, which has an electrical insulation layer thereon formed by, for example, oxidizing the surface thereof, a substrate made of thermosetting resin or thermoplastic resin, a film made of thermosetting resin or thermoplastic-resin (a plastic film), etc., may be employed.

When the organic electroluminescent device 1 is of a so-called back emission type, one of a transparent substrate and a translucent substrate must be employed as the substrate 20 because light is emitted through the substrate 20. As an example of the transparent or translucent substrate, a substrate made of glass, silica, or resin (plastic or plastic film), etc., may be employed, and in particular, a glass substrate is preferably employed. In this embodiment, the organic electroluminescent device 1 is of a top emission type, in which light is emitted through a protection layer 30; therefore, an opaque substrate, such as an opaque plastic film, is employed as the substrate 20.

Figure 8:
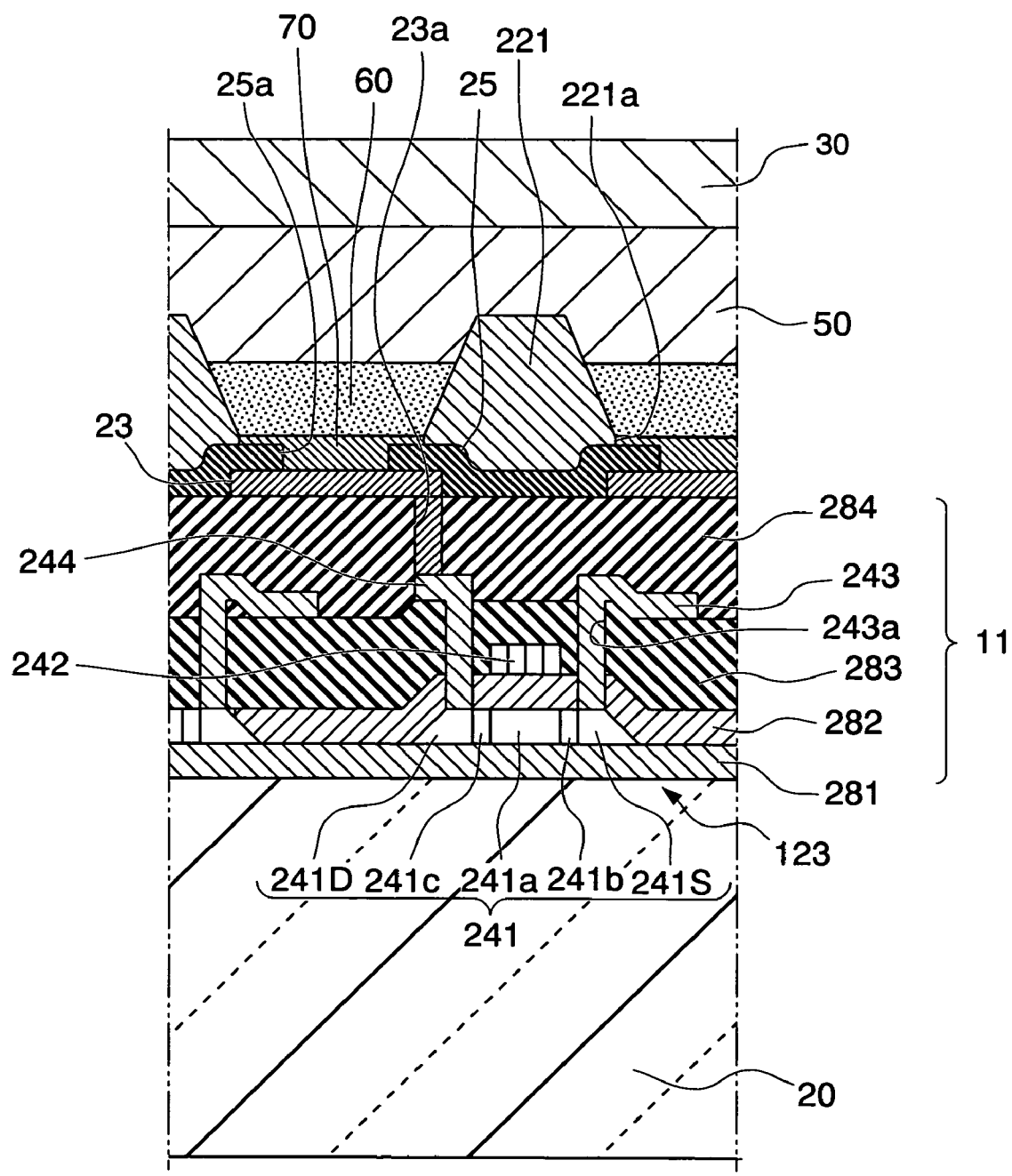
FIG. 8 is an enlarged cross-sectional view showing the main portion in FIG. 7.

On the substrate 20, there is formed a circuit section 11 which includes driving TFTs 123 for driving the pixel electrodes 23, and on which many luminescent elements (organic electroluminescent elements) are formed. As shown in FIG. 8, each of the luminescent elements includes, in order, the pixel electrode 23 acting as an anode electrode, a hole transport layer 70 into which holes from the pixel electrode 23 are injected and through which the holes are transported, the luminescent layer 60 including an organic luminescent substance which is one of electro-optical substances, and a cathode electrode 50.

Each of the luminescent elements constructed as described above emits light when, in the luminescent layer, the holes ejected from the hole transport layer 70 are combined with electrons ejected from the cathode electrode 50.

Because the organic electroluminescent device 1 is of a top emission type, the pixel electrodes 23 do not have to be transparent; therefore, the pixel electrodes 23 may be made of an appropriate conductive material.

As an example of the material for forming the hole transport layer 70, a polythiophene derivative, a polypyrrole derivative, or compounds doped therewith may be used. More specifically, for example, a dispersed liquid which is obtained by dispersing poly-3,4-ethylenedioxythiophene/polystyrene sulfonic acid (PEDOT/PSS) (product name; Bytron-p: made by Bayer AG), i.e., 3,4-polyethylene dithiophene is dispersed in polystyrene sulfonic acid as a dispersion medium, and by further dispersing in water, may be used.

As the material for forming the luminescent layer 60, a well-known luminescent material which is capable of emitting fluorescent or phosphorescent light may be used. More specifically, a (poly) fluorene derivative (PF), a (poly) paraphenylenevinylene derivative (PPV), a polyphenylene derivative (PP), a polyparaphenylene derivative (PPP), poly-vinylcarbazole (PVK), polythiophene derivative, or poly silane type such as polymethyl phenylsilane (PMPS) may preferably be used.

Moreover, in these high molecular materials, other high molecular materials such as a pigment of the perylene type, a pigment of the cumarin type, a pigment of the rhodamine type, or low molecular materials such as rubrene, perylene, 9,10-diphenylanthracene, tetraphenyl butadiene, nile red, cumarin 6, and quinacridon, may be doped.

In addition, instead of the above high molecular materials, well-known low molecular materials can also be used.

As necessary, an electron injection layer may be formed on the luminescent layer 60 constructed as described above.

As shown in FIGS. 7 and 8, in this embodiment, the hole transport layer 70 and the luminescent layer 60 are surrounded by a liquid-affinity control layer 25 and an organic bank layer 221, each of which is formed in a grid pattern. As a result, each portion of the hole transport layer 70 and the luminescent layer 60 having a rectangular shape in plan view constitutes an element layer, i.e., a single luminescent element (an organic electroluminescent element).

As shown in FIGS. 7 and 8, the cathode electrode 50 has a wider area that the total area of the actual display region 4 and the dummy region 5, which are covered by the cathode electrode 50. The cathode electrode 50 is formed on the base body 200 so as to cover the luminescent layer 60, the organic bank layer 221, an upper surface of a surrounding element 201, and an outer peripheral surface 201a of the surrounding element 201.

In this embodiment, the material for forming the cathode electrode 50 must be optically transparent to form a top emission type display, and accordingly, a transparent and conductive material is used. In general, ITO (Indium Tin Oxide) is preferable as the transparent and conductive material; however, for example, an indium oxide and zinc oxide amorphous transparent conductive film (Indium Zinc Oxide: IZO™ (a product made by ldemitsu Kosan Co., Ltd.) may also be used. In this embodiment, ITO is used.

On the cathode electrode 50, there is formed the protection layer 30 so as to cover an exposed portion of the cathode electrode 50 formed on the base body 200. The protection layer 30 is provided for preventing oxygen and water from intruding into the cathode electrode 50 and the luminescent layer 60, so that deterioration of the cathode electrode 50 and the luminescent layer 60 due to oxygen and water is avoided.

As shown in FIG. 8, the circuit section 11 is formed under the above-mentioned luminescent elements. The circuit section 11 is formed on the substrate 20 so as to constitute a portion of the base body 200. More specifically, a primer protection layer 281, which is primarily made of $SiO_2$, is formed on the surface of the substrate 20, and a silicon layer 241 is formed on the primer protection layer 281. On the surface of the silicon layer 241, there is formed a gate insulation layer 282 which is primarily made of $SiO_2$ and/or SiN.

A portion of the silicon layer 241, which overlaps a gate electrode 242 so as to sandwich the gate insulation layer 282 therebetween, is a channel region 241a. The gate electrode 242 forms a portion of the scanning lines 101 (not shown in FIG. 8). On the other hand, a first inter-layer insulation layer 283, which is primarily made of $SiO_2$, is formed on the surface of the gate insulation layer 282 which covers the silicon layer 241 to form the gate electrode 242.

In addition, a low concentration source region 241b and a high concentration source region 241S are formed in a source side portion, with respect to the channel region 241a, of the silicon layer 241, and a low concentration drain region 241c and a high concentration drain region 241D are formed in a drain side portion, with respect to the channel region 241a, of the silicon layer 241, so that a so-called LDD (Light Doped Drain) structure is constructed. Among these regions, the high concentration source region 241S is connected to a source electrode 243 via a contact hole 243a which is formed through the gate insulation layer 282 and the first inter-layer insulation-layer 283. The source electrode 243 forms a portion of the above-mentioned source line 103 (see FIG. 5, the source line 103 extends, at a position of the source electrode 243, perpendicularly to the plane of FIG. 8). On the other hand, the high concentration drain region 241D is connected to a drain electrode 244, which is formed in the same layer as the source electrode 243, via a contact hole 244a which is formed through the gate insulation layer 282 and the first inter-layer insulation layer 283.

The upper layer of the first inter-layer insulation layer 283 in which source electrode 243 and the drain electrode 244 is covered by a second inter-layer insulation layer 284 which is primarily made of, for example, acrylic resin. The second inter-layer insulation layer 284 may be made of a material other than the acrylic insulation resin, SiN, $SiO_2$, etc. The pixel electrodes 23 made of ITO are formed on the surface of the second inter-layer insulation layer 284, and are connected to the drain electrode 244 via a contact hole 23a formed in the second inter-layer insulation layer 284. More specifically, the pixel electrodes 23 are connected to the high concentration drain region 241D in the silicon layer 241 via the drain electrode 244.

The TFTs (i.e., driving TFTs) included in the scanning line drive circuit 80 and in the test circuit 90, i.e., N-channel type TFTs or P-channel type TFTs for forming inverters included in the shift resisters in the driving circuits have a construction similar to that of the above-mentioned driving TFTs 123, except for not being connected to the pixel electrodes 23.

On the surface of the second inter-layer insulation layer 284 having the pixel electrodes 23, the pixel electrodes 23 and the above-mentioned liquid-affinity control layer 25 and organic bank layer 221 are disposed. The liquid-affinity control layer 25 is primarily made of a liquid-affinity material such as $SiO_2$, the organic bank layer 221 is primarily made of acryl, polyimide, etc.

The hole transport layer 70 is deposited on each of the pixel electrodes 23 while being disposed in an aperture 25a formed in the liquid-affinity control layer 25, and the luminescent layer 60 is deposited on the hole transport layer 70 while being disposed in an aperture 221a surrounded by the organic bank layer 221. Note that, in this embodiment, the term "liquid-affinity" regarding the liquid-affinity control layer 25 means that the material has a liquid-affinity property which is, at least, more significant than that of acryl or polyimide which is used for forming the organic bank layer 221.

The circuit section 11 is formed by the layers up to the second inter-layer insulation layer 284, which are formed on the above-mentioned substrate 20.

In the organic electroluminescent device 1 of this embodiment, the luminescent layers 60 include luminescent layers whose light wavelengths correspond to one of three primary colors of light, i.e., the luminescent layers 60 include red luminescent layers 60R, green luminescent layers 60G, and blue luminescent layers 60B, each of which corresponds to one of the sub-pixels R, G, and B. In this embodiment, as shown in FIGS. 2A to 2E, six sub-pixels form a unit pixel L (theoretical pixel) for color display.

Next, an example of a method for fabricating the organic electroluminescent device 1 of this embodiment will be explained below with reference to FIGS. 9A to 9O. In this embodiment, the organic electroluminescent device 1 is of a top emission type. The cross sections shown in FIGS. 9A to 9O are taken along the line A–B in FIG. 6.

Figure 9A:
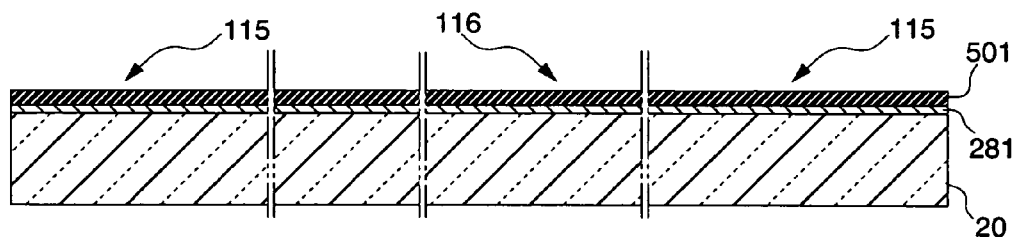
FIGS. 9A to 9O are cross-sectional views showing the processes for manufacturing the organic electroluminescent device.

First, as shown in FIG. 9A, the primer protection layer 281 is formed on the substrate 20. Next, an amorphous silicon layer 501 is formed on the-primer protection layer 281 using an ICVD method, a plasma CVD method, or the like, and then the amorphous silicon layer 501 is transformed into a polysilicon layer by crystal growth using a laser annealing method or rapid heating method.

Figure 9B:
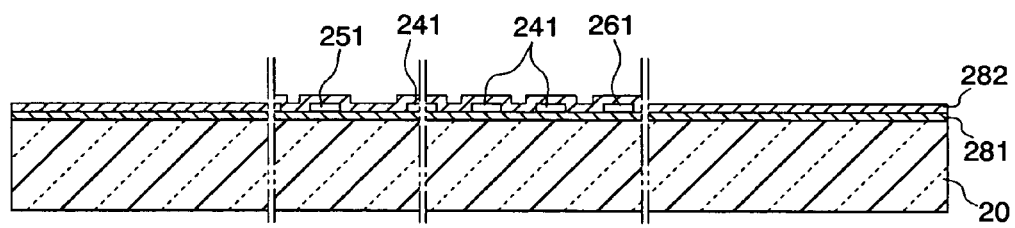

Next, as shown in FIG. 9B, the polysilicon layer is trimmed by a photolithography method so as to form silicon layers 241, 251, and 261, each of which has an island shape. The silicon layer 241 is formed in the display region, and forms a portion of the driving TFT 123 which is connected to the pixel electrode 23. The silicon layers 251 and 261 respectively form the P-channel type TFT and N-channel type TFT (TFT for driving circuit), included in the scanning line driving circuits 80.

Next, the gate insulation layer 282, which is a silicon oxide layer having a thickness of approximately 30 to 200 nm, is formed on the entire surface of the silicon layers 241, 251, and 261, and the primer protection layer 281, using a plasma CVD method, a heat oxidizing method, or the like. When the heat oxidizing method is used for forming the gate insulation layer 282, the silicon layers 241, 251, and 261 can be crystallized so as to be transformed into the polysilicon layer.

When a channel doping is required for the silicon layers 241, 251, and 261, boron ions are bombarded into the silicon layers 241, 251, and 261 at this stage at a dose of approximately $1 \times 10^{12}/cm^2$. As a result, the silicon layers 241, 251, and 261 are transformed into low concentration P-type silicon layers having an impurity concentration of approximately $1 \times 10^{17}/cm^3$ (the impurity concentration is calculated based on the impurities after an activation annealing).

Next, an ion injection covering mask is formed on a portion of the channel layers of the P-channel type TFT and N-channel type TFT, and in this state, phosphorous ions are injected at a dose of approximately $1 \times 10^{15}/cm^2$. As a result, high concentration impurities are introduced into the patterning mask in a self-aligning manner, and as shown in FIG. 9C, the high concentration source region 241S and 261S, and the high concentration drain region 241D and 261D are formed in the silicon layers 241 and 261.

Figure 9C:
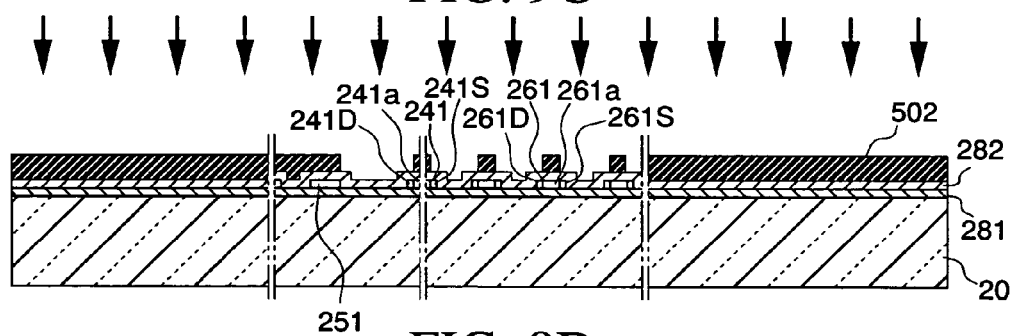
Figure 9D:
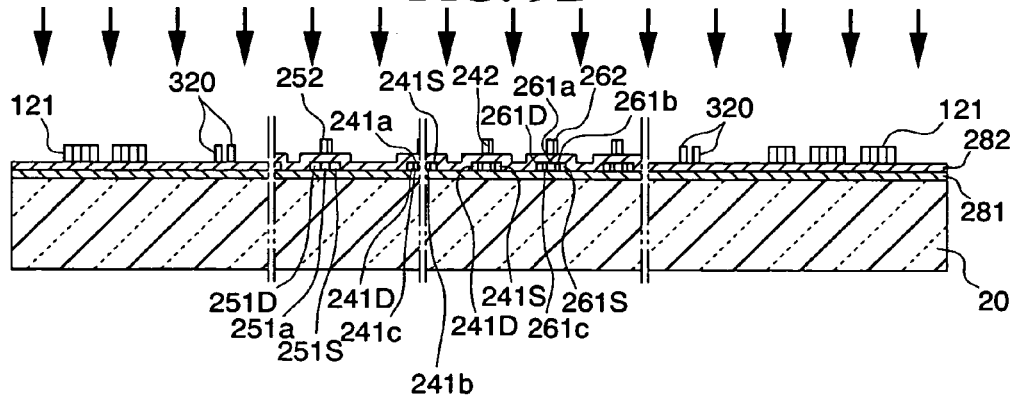

Next, as shown in FIG. 9C, a gate electrode forming conductive layer 502 made of a metal film, such as a doped silicon film or a silicide film, an aluminum film or a chromium film, or a tantalum film, is formed on the entire surface of the gate insulation layer 282. The thickness of the conductive layer 502 is approximately 500 nm. Then, as shown in FIG. 9D, a gate electrode 252 for forming the P-channel type driving TFT, a gate electrode 242 for forming the pixel TFT, and a gate electrode 262 for forming the N-channel type driving TFT are formed using a patterning process. In addition, at the same time, the drive control signal supply path 320 and a first layer 121 for the cathode source line are also formed. The drive control signal supply path 320 is formed in the dummy region 5.

Consequently, as shown in FIG. 9D, phosphorous ions are injected into the silicon layers 241, 251, and 261 at a dose of approximately $4 \times 10^{13}/cm^2$ while using the gate electrodes 242, 252, and 262 as a covering mask. As a result, low concentration impurities are introduced into the gate electrodes 242, 252, and 262 in a self-aligning manner, and as shown in FIG. 9D, the low concentration source region 241b and 261b, and the low concentration drain region 241c and 261c are formed in the silicon layers 241 and 261. In addition, low concentration impurity regions 251S and 251D are formed in the silicon layer 251.

Figure 9E:
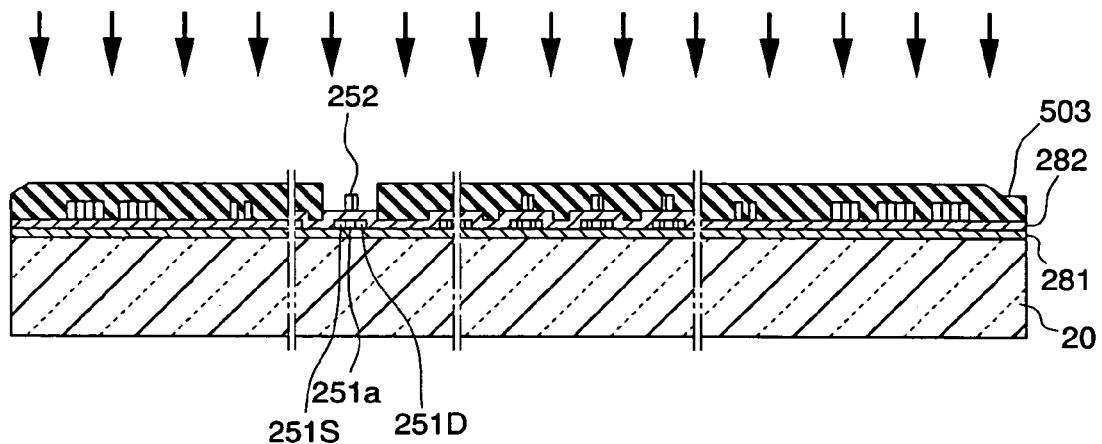

Next, as shown in FIG. 9E, an ion injection covering mask 503, which covers an area other than the TFT for the P-channel type drive circuit, is formed. Boron ions are injected into the silicon layer 251 at a dose of approximately $1.5 \times 10^{15}/cm^2$ while using the ion injection covering mask 503. As a result, the gate electrode 252 for forming the TFT for the P-channel type drive circuit also acts as a mask, and high concentration impurities are doped into the silicon layer 252 in a self-aligning manner. Accordingly, the low concentration impurity regions 251S and 251D are counter-doped, and are transformed into source region and drain region for the TFT for the drive circuit.

Figure 9F:
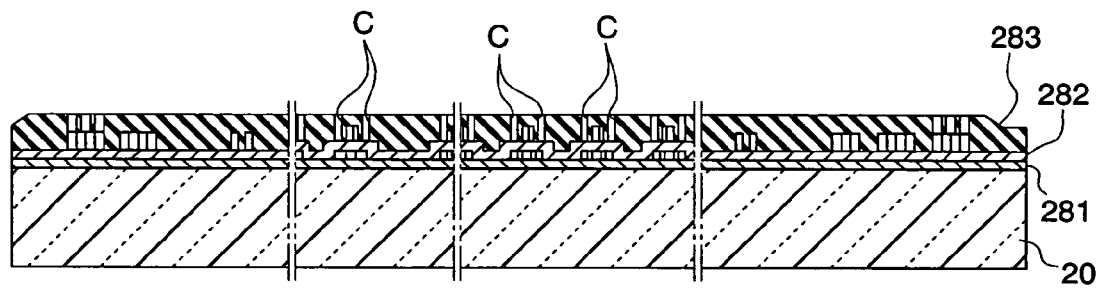

Next, as shown in FIG. 9F, the first inter-layer insulation layer 283 is formed over the entirety of the substrate 20, and contact holes C are formed in the first inter-layer insulation layer 283 at positions corresponding to the source electrodes and drain electrodes of the TFTs by patterning the first inter-layer insulation layer 283 using a photolithography method.

Figure 9G:
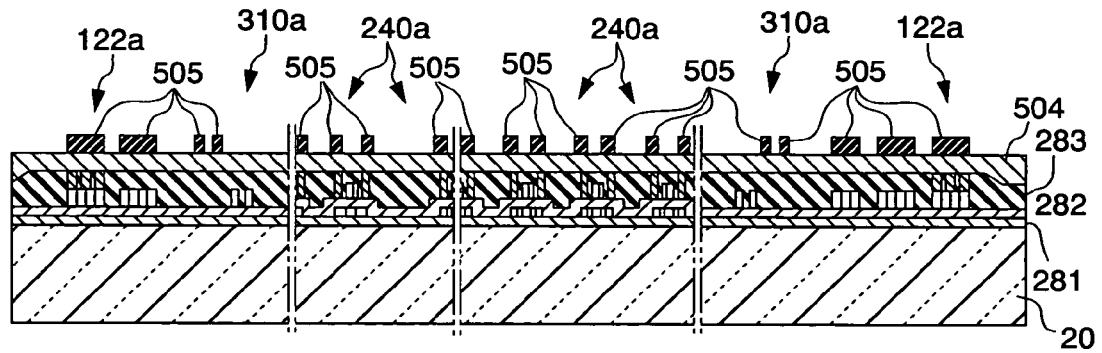
Figure 9H:
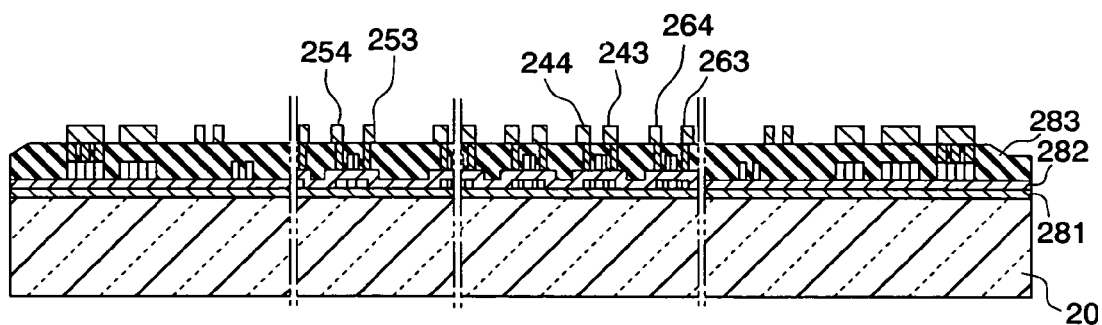

Next, as shown in FIG. 9G, a conductive layer 504 made of a metal such as aluminum, chromium, or tantalum, is formed so as to cover the first inter-layer insulation layer 283. The thickness of the conductive layer 504 is approximately 200 nm to 800 nm. Then, a patterning mask 505 is formed so as to cover a region 240a in which the source electrodes and drain electrodes of the TFTs are to be formed, a region 310a in which the drive voltage supply path 310, and a region 122a in which a second layer for the cathode source line is to be formed, and the source electrodes 243, 253, and 263, and the drain electrodes 244, 254, and 264 are formed by patterning the conductive layer 504, as shown in FIG. 9H.

Figure 9I:
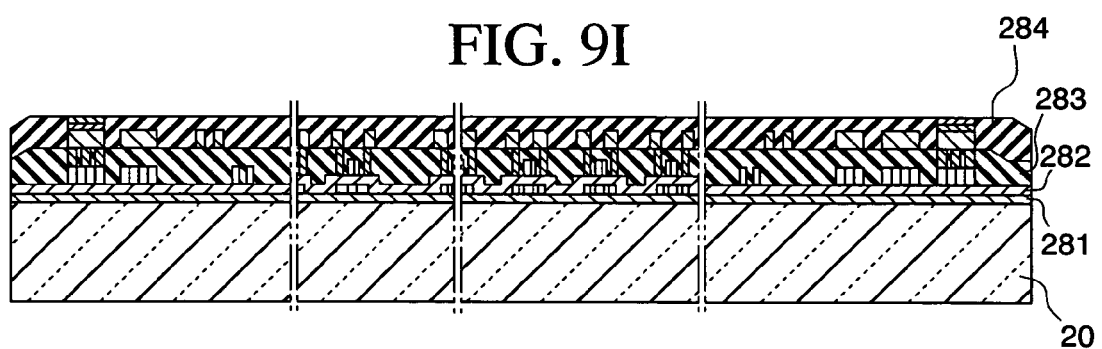

Next, as shown in FIG. 9I, the second inter-layer insulation layer 284 for covering the first inter-layer insulation layer 283 on which the above-mentioned elements are formed is formed using a high molecular material such as acrylic resin. The second inter-layer insulation layer 284 is preferably approximately 1 to 2 μm thick. The second inter-layer insulation layer 284 may be made of SiN or $SiO_2$. When the second inter-layer insulation layer 284 is made of SiN, the thickness thereof is preferably 200 nm, and when made of $SiO_2$, the thickness thereof is preferably 800 nm.

Figure 9J:
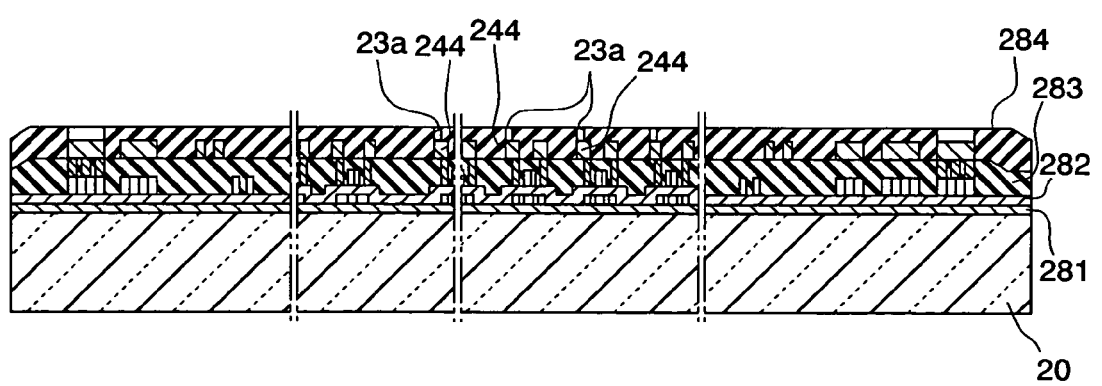

Next, as shown in FIG. 9J, the contact holes 23a are formed by removing, by etching, a portion of the second inter-layer insulation layer 284 corresponding to the drain electrode 244 of the driving TFT.

Figure 9K:
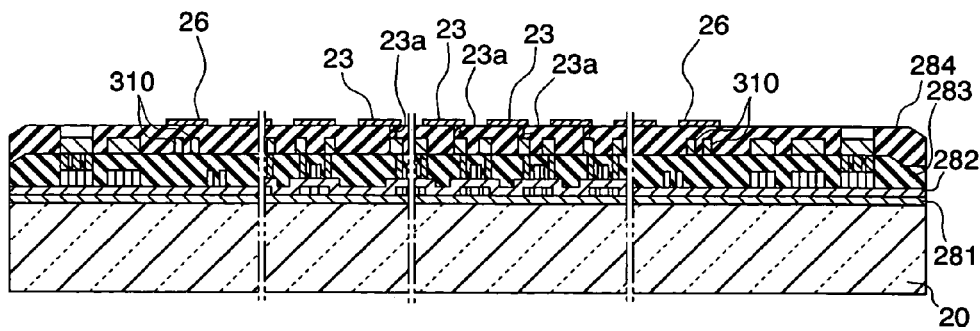

Then, a conductive film for forming the pixel electrodes 23 is formed so as to cover the entirety of the substrate 20. As shown in FIG. 9K, the pixel electrodes 23 electrically connected to the drain electrodes 244 via the contact holes 23a, as well as dummy patterns 26 in the dummy region, by patterning the transparent conductive film. Note that the pixel electrode 23 in FIG. 7 includes pixel electrodes 23 and the dummy patterns 26.

The dummy patterns 26 are not connected to the metal lines in the lower layers via the second inter-layer insulation layer 284. More specifically, the dummy patterns 26 are arranged in an island pattern, each of which has substantially the same shape as the pixel electrodes 23 formed in the actual display region. The shape of each of the dummy patterns 26 may be different from the shape of each of the pixel electrodes 23 formed in the actual display region. The dummy patterns 26 must be arranged at least above the drive voltage supply path 310.

Figure 9L:
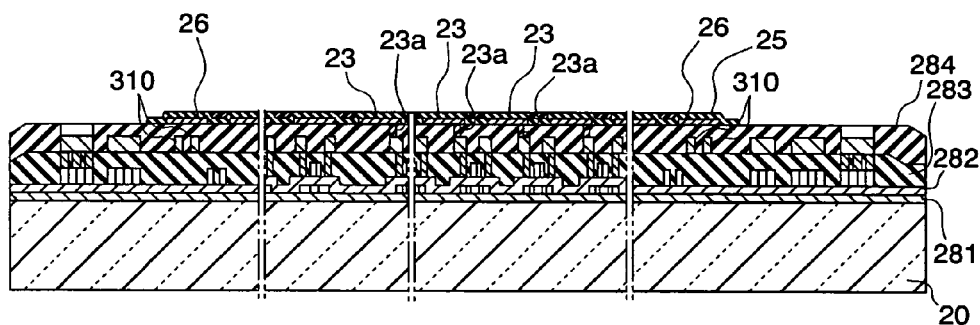

Next, as shown in FIG. 9L, the liquid-affinity control layer 25, which is an electric insulation layer, is formed on the pixel electrodes 23, the dummy pattern 26, and the second inter-layer insulation layer 284. The liquid-affinity control layer 25 is formed so as to have apertures 25a near the pixel electrodes 23 (also refer to FIG. 7) so that holes can be transported. In contrast, the apertures 25a are not formed near the dummy patterns 26 so that holes cannot be transported because the insulation layer 25 (the liquid-affinity control layer) blocks movement of holes.

Figure 9M:
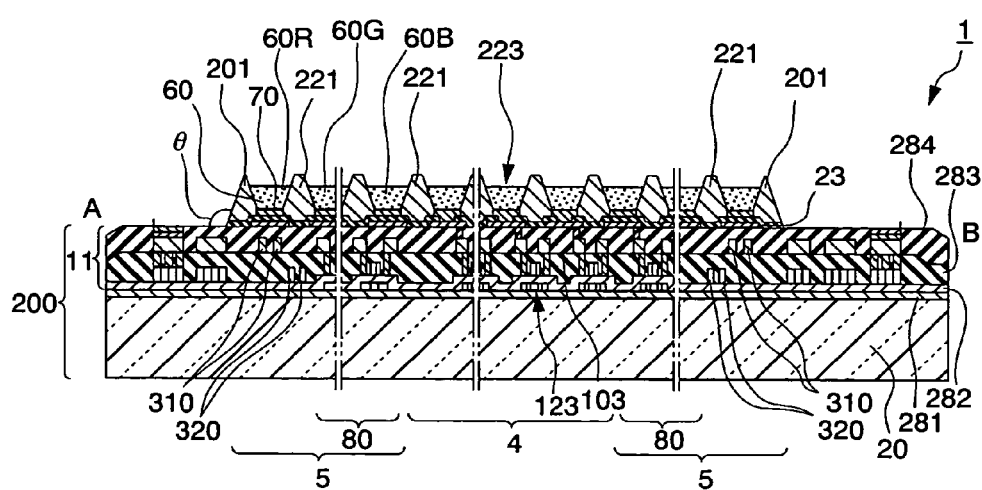

Next, as shown in FIG. 9M, the organic bank layers 221 are formed on the predetermined portions of the liquid-affinity control layer 25. In a practical method for forming the organic bank layers, a solution, in which a resist, such as acrylic resin or polyimide resin, is dissolved in a solvent, is coated using a spin coating method, a dip coating method, or the like. The material for forming the organic layers may be any material which cannot be dissolved in ink solvent, which will be explained below, and which is easy to be trimmed in a pattern by etching or the like.

Consequently, the organic layers are trimmed (or patterned) using a photolithography method or an etching method so as to form the bank apertures 221a, and thus to form the organic bank layer 221 having the bank apertures 221a therein.

Next, a region having liquid-affinity and a region having liquid-repellency are formed on the surface of the organic bank layer 221. In this embodiment, these regions are formed by a plasma treatment process. More specifically, the plasma treatment process includes a preliminary heating process, an ink-affinity treatment process in which the upper surface of the organic bank layer 221, peripheral walls surrounding the bank apertures 221a, the electrode surface of the pixel electrodes 23, and the upper surface of the liquid-affinity control layer 25 are made to have liquid-affinity, an ink-repellency treatment process in which the upper surface of the organic bank layer 221 and the peripheral walls surrounding the bank apertures 221a are made to have ink-repellency, and a cooling process.

More specifically, the substrate (the substrate 20 having the bank layers) is heated to, for example, 70 to 80° C., and then a plasma treatment ($O_2$ plasma treatment) as the ink-affinity treatment process, in which oxygen is used as a reaction gas, is applied to the substrate under atmospheric conditions. Next, another plasma treatment ($CF_4$ plasma treatment) as the ink-repellency treatment process, in which tetrafluoromethane is used as a reaction gas, is applied to the substrate under atmospheric conditions, and then the substrate, which has been heated due to the plasma treatments, is cooled to room temperature to obtain the region having liquid-affinity and the region having liquid-repellency.

During the $CF_4$ plasma treatment, the electrode surface of the pixel electrodes 23 and the liquid-affinity control layer 25 are also affected more or less; however, because ITO for forming the pixel electrodes 23 and $SiO_2$ and $TiO_2$ for forming the liquid-affinity control layer 25 have little affinity to fluorine, and because the hydroxyl group applied thereto by the ink-affinity treatment process is not replaced by a fluorine group, liquid-affinity thereof is maintained.

Next, the hole transport layer 70 is formed through a hole transport layer forming process. The process for forming the hole transport layer 70 on the pixel electrodes 23 includes a coating process in which a hole transport layer material is coated on the pixel electrodes 23 using a droplet ejecting method such as an ink-jet method, or spin coating method, a drying process, and a heat treatment process. The ink-jet method for selectively applying the hole transport layer material includes the step of filling an ink-jet head (not shown) with the hole transport layer material, arranging the ink-jet head so that the ejecting nozzles thereof face the electrode surface of the pixel electrodes 23 disposed in the apertures 25a formed in the liquid-affinity control layer 25, and ejecting droplets, each of which is controlled so as to have a predetermined amount, from the ejecting nozzles onto the electrode surface while moving the ink-jet head and the substrate (substrate 20) with respect to each other. Next, the droplets which have been ejected are dried so that dispersion medium and solvent included in the hole transport layer material are evaporated, and so that the hole transport layer 70 is formed.

The droplets ejected from the ejecting nozzles spread over the electrode surface to which the liquid-affinity treatment process has been applied, and fill the apertures 25a in the liquid-affinity control layer 25. On the other hand, the droplets are repelled and do not stay on the upper surface of the organic bank layer 221; to which the ink-repellency treatment process has been applied. Accordingly, even when the droplets are not ejected onto the predetermined locations, but are ejected onto the upper surface of the organic bank layer 221, the upper surface will not be wet with the droplets, and the repelled droplets move into the apertures 25a in the liquid-affinity control layer 25.

The processes after this process for forming the hole transport layer are preferably performed under an inert gas atmosphere such as a nitrogen atmosphere or an argon atmosphere in order to avoid oxidization of the hole transport layer 70 and the luminescent layer 60.

Next, the luminescent layer 60 is formed through a luminescent layer forming process. The process for forming the luminescent layer 60 in the apertures 221a formed in the organic bank layer 221 includes an ejecting process in which a luminescent layer material is ejected on the hole transport layer 70 using, for example, the above-mentioned ink-jet method, a drying process, and a heat treatment process. In the luminescent layer forming process, in order to avoid dissolution of the hole transport layer 70, a nonpolar solvent, which does not dissolve the hole transport layer 70, is used for the luminescent layer material.

In the luminescent layer forming process, a blue luminescent layer material is selectively coated on the display regions for blue light using the ink-jet method, and is dried, and then, similarly, green luminescent layer material and red luminescent layer material are selectively coated on the display regions for green light and red light, and are dried, respectively.

As necessary, an electron injection layer may be formed on the above-mentioned luminescent layer 60.

Figure 9N:
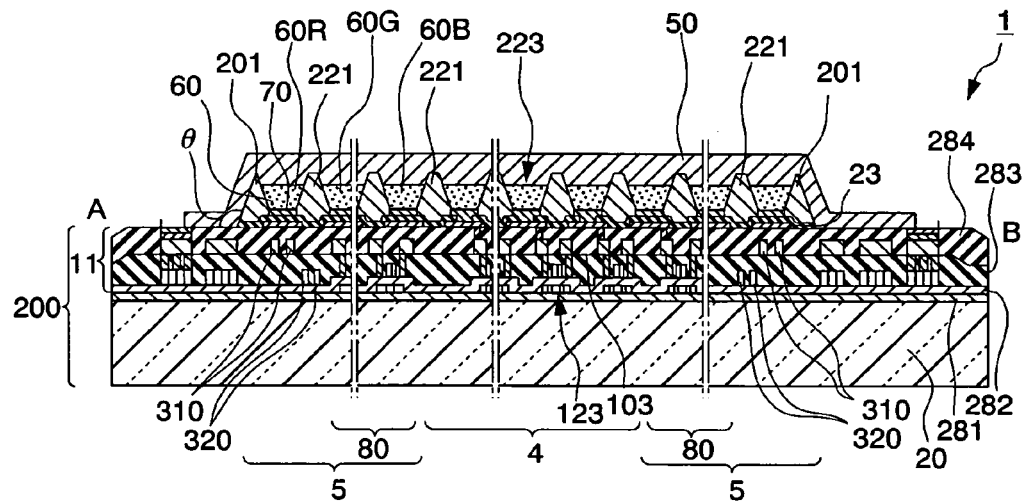
Figure 9O:
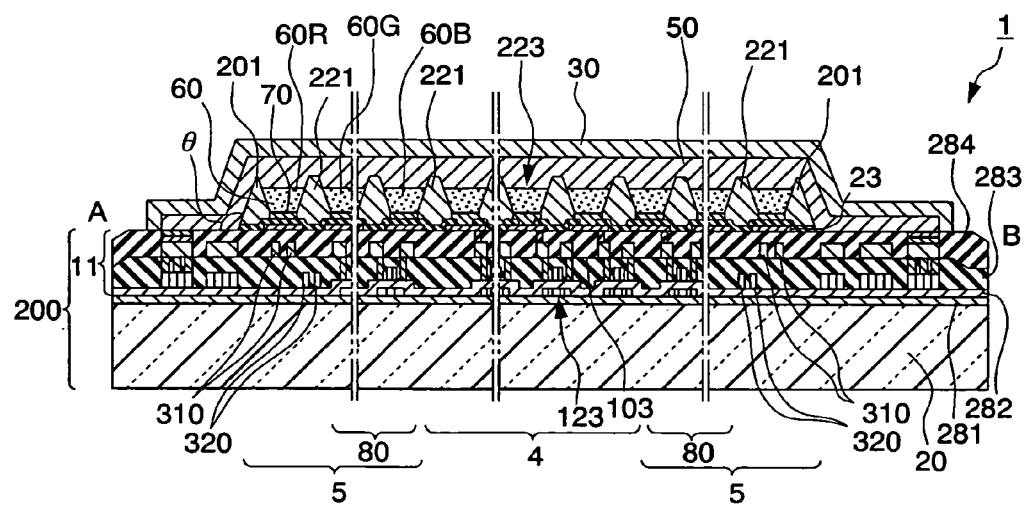

Next, as shown in FIG. 9N, the cathode electrode 50 is formed through a cathode electrode forming process. In the cathode electrode forming process, the cathode electrode 50 is formed by forming a film of ITO using a physical gas-phase deposition method such as a vapor deposition method.

Next, as shown in FIG. 9O, the protection layer 30 is formed so as to cover the cathode electrode 50, i.e., to cover the entirety of the cathode electrode 50 which is exposed on the base body 200, and then, as conventionally, sealing by a sealing substrate or by sealing cans is applied (not shown) to obtain the organic electroluminescent device (electro-optical device) of the present invention.

In the organic electroluminescent device 1, because the sub-pixels S (R, G, and B) are arranged in the arrangement patterns P shown-in FIG. 1, and each pixel L (theoretical pixel) includes six sub-pixels, the apparent resolution due to the actually perceived light intensity can be improved even though the sub-pixel density (i.e., density of TFT) is set to be substantially the same as in conventional displays.

Accordingly, excellent image display with high resolution can be achieved, high quality and stable quality of the display can be achieved, and throughput of the displays can be increased. Moreover, when the organic electroluminescent device 1 is formed so as to have the same resolution as that of conventional displays, electrical power consumption and manufacturing cost can be reduced.

In addition, when the sub-pixels S (R, G, and B) are arranged in the arrangement patterns P shown in FIG. 1, the organic bank layer 221 and the like can be fabricated by applying the manufacturing process for the displays of a stripe pattern or a mosaic pattern; therefore, the colored sub-pixels can be easily formed.

Figure 10A:
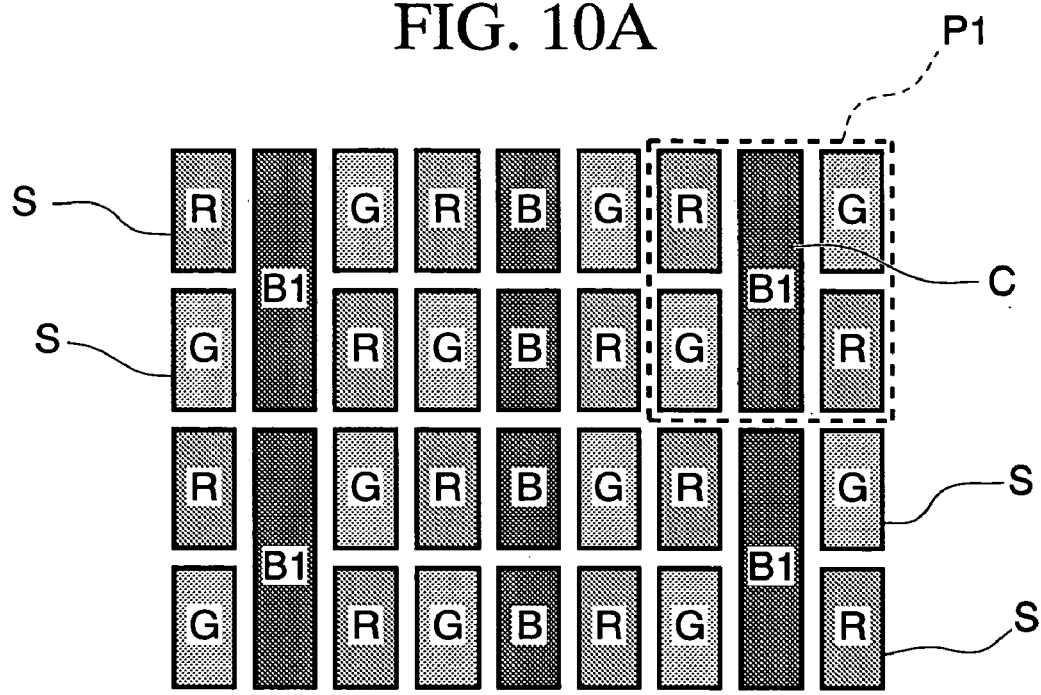
FIG.10A and 10B are diagrams showing other arrangement patterns of sub-pixels.
Figure 10B:
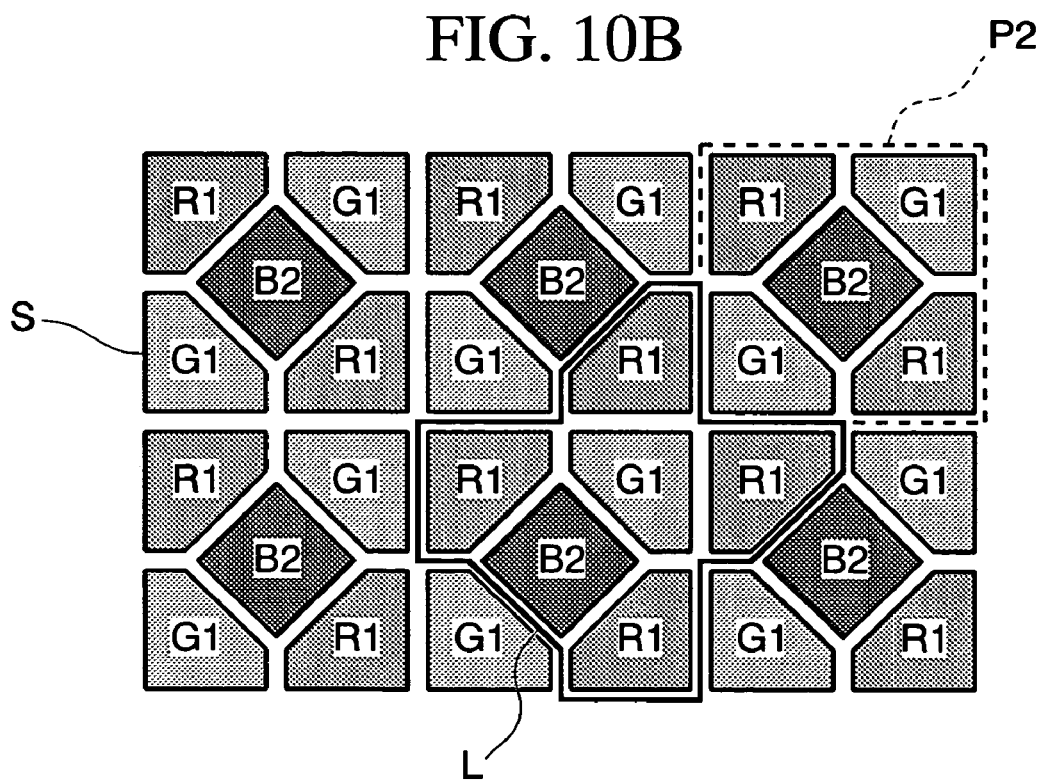

In the above embodiment, the sub-pixels S (R, G, and B) are arranged in the arrangement patterns P shown in FIG. 1; however, the present invention is not limited to this, and an arrangement pattern P1 shown in FIG. 10A or an arrangement pattern P2 shown in FIG. 10B may be employed. The arrangement pattern P1 shown in FIG. 10A differs from the pattern P shown in FIG. 1 in that the central pattern C consists of just one large blue sub-pixel B1 in contrast to the central pattern C in the pattern P shown in FIG. 1, which consists of two blue sub-pixels B.

According to this arrangement, the sub-pixels can be formed by applying the manufacturing process for the sub-pixels of a stripe pattern or a mosaic pattern, as in the case of the pattern P; therefore, the colored sub-pixels can be easily formed. In addition, because-the large sub-pixel B1 is equivalent to the two blue sub-pixels B in the arrangement pattern P shown in FIG. 1, the number of the driving elements such as the switching elements can be reduced; therefore, reduction in manufacturing cost and size reduction can be achieved.

The arrangement pattern P2 shown in FIG. 10B is completely different from the arrangement patterns P and P1. The arrangement pattern P2 includes a square blue sub-pixel B2 as a central pattern C, two pentangular red sub-pixels R1 arranged symmetrically about the central pattern C, and two pentangular green sub-pixels G1 arranged symmetrically about the central pattern C. Each of the pentangular red and green sub-pixels R1 and G1 is disposed adjacent to one of sides of the square blue sub-pixel B2. The arrangement pattern P2 including the square blue sub-pixel B2, the two pentangular red sub-pixels R1, and the two pentangular green sub-pixels G1 is formed, overall, in a substantially square shape.

As shown in FIG. 10B, in the luminescent layer having the arrangement patterns P2, each of unit pixels L (theoretical pixels) for color display includes one blue sub-pixel B2, one green sub-pixel G1 disposed adjacent to the blue sub-pixel B2, and four red sub-pixels R1 disposed adjacent to the green sub-pixel G1. As in the case shown in FIG. 2, the unit pixels L (theoretical pixels) may be formed by interchanging the red sub-pixel R1 and the green sub-pixel G1.

By employing the theoretical pixels L, each of which include the four red sub-pixels R1, and the theoretical pixels L, each of which include the four green sub-pixels G1, as in the arrangement pattern P shown in FIG. 1, the apparent resolution due to the actually perceived light intensity can be significantly improved even though the sub-pixel density (i.e., density of TFT) is set to be substantially the same as in conventional displays.

The organic electroluminescent device 1 is of an active matrix type in which the thin film transistors (TFTs) are employed as the switching elements; however, when the sub-pixels S (R, G, and B) are formed in a complicated shape as shown in FIG. 10B, the film-forming processes for manufacturing the TFT circuits and the luminescent layers become complicated, and the number of processes may be increased. This disadvantage can be overcome by employing a passive drive method instead of the active drive method.

In the above description, the organic electroluminescent device 1 was explained as a display of top emission type; however, the present invention is not limited to this, and the present invention can be applied to a display of back emission type, or to a display having two display surfaces facing opposite directions.

In the cases of displays of a back emission type or a two display surface type, it is preferable that the switching TFTs and the driving TFTs, which are to be formed on the base body 200, be formed under the liquid-affinity control layer 25 and the organic bank layer 221, not directly under the luminescent elements, so that an aperture ratio can be increased.

Next, an electronic apparatus according to the present invention will be explained. The electronic apparatus according to the present invention, shown in FIG. 11, includes the organic electroluminescent device 1 as a display section.

Figure 11:
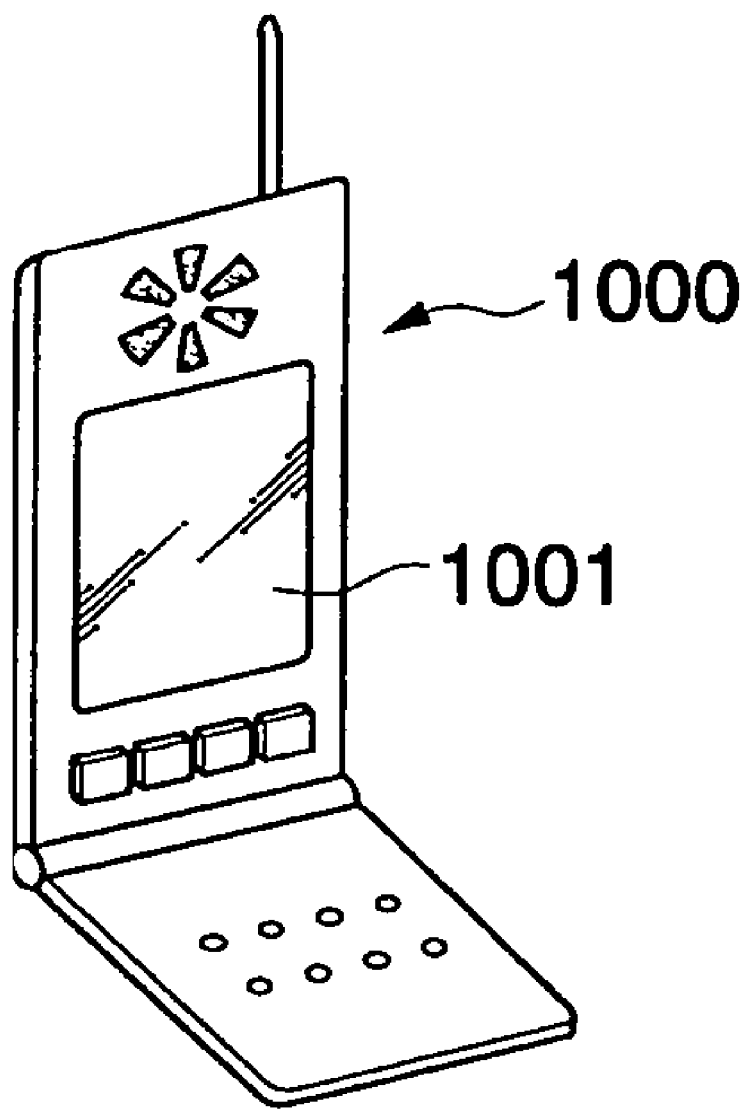
FIG. 11 is a perspective view showing an electronic apparatus of the present invention.

FIG. 11 is a perspective view showing a cellular phone. In FIG. 11, reference numeral 1000 indicates a cellular phone body, and reference numeral 1001 indicates a display section employing the above-mentioned organic electroluminescent device.

Because the cellular phone (electronic apparatus) includes the organic electroluminescent device 1, an excellent display performance can be achieved.

The electronic apparatus according to the present invention is not limited to the cellular phone, the present invention can also be applied to portable information processing apparatuses such as a wristwatch type electronic apparatus, a word processor, a personal computer, etc.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An organic electroluminescent device comprising:
   electrodes; and
   a luminescent layer which is sandwiched between the electrodes, and which includes dots consisting of red sub-pixels, green sub-pixels, and blue sub-pixels;
   wherein the sub-pixels are arranged in predetermined patterns, each of the predetermined patterns being formed such that at least one of the blue sub-pixels is disposed as a central pattern, the red sub-pixels are symmetrically arranged about a central point of the central pattern, and the green sub-pixels are also symmetrically arranged about the central point of the central pattern, and
   wherein the red sub-pixels and the green sub-pixels are commonly used in plural theoretical pixels.

2. An organic electroluminescent device according to claim 1, wherein each of the sub-pixels is formed in a rectangular shape, and the central pattern consists of two blue sub-pixels.

3. An organic electroluminescent device according to claim 1, wherein each of the sub-pixels is formed in a rectangular shape, and the central pattern consists of one blue sub-pixel, which is made longer than the red and green sub-pixels.

4. An organic electroluminescent device according to claim 1,
   wherein the blue sub-pixels are formed in a square shape, and the central pattern consists of one blue sub-pixel, and
   wherein each of the predetermined patterns is formed in a substantially square shape, and is formed such that each of the red and green sub-pixels is disposed adjacent to one of sides of the square-shaped blue sub-pixel.

5. An electronic apparatus comprising the organic electroluminescent device according to claim 1.

6. An organic electroluminescent device according to claim 1, wherein the red sub-pixels and the green sub-pixels are commonly used in at east five theoretical pixels.

7. An organic electroluminescent device according to claim 1, wherein the theoretical pixels include:
   four sub-pixels arranged in a first direction; and
   two sub-pixels respectively disposed on both sides in a second direction with respect to one sub-pixel among the four sub-pixels.

* * * * *